(12) United States Patent    (10) Patent No.:   US 12,690,420 B2

Kikuchi et al.    (45) Date of Patent:   Jul. 21, 2026

(54) SEMICONDUCTOR DEVICE PRODUCTION METHOD

(71) Applicant: Tokyo Ohka Kogyo Co., Ltd., Kawasaki (JP)

(72) Inventors: Yubun Kikuchi, Kawasaki (JP); Yoshihiro Yamada, Kawasaki (JP); Ryuma Mizusawa, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 378 days.

(21) Appl. No.: 18/431,549

(22) Filed: Feb. 2, 2024

(65) Prior Publication Data

US 2024/0282616 A1    Aug. 22, 2024

(30) Foreign Application Priority Data

Feb. 21, 2023   (JP) .................................. 2023-025032

(51) Int. Cl.
*H10P 72/70*      (2026.01)
*H10P 54/00*      (2026.01)

(52) U.S. Cl.
CPC .............. *H10P 72/74* (2026.01); *H10P 54/00* (2026.01); *H10P 72/7416* (2026.01); *H10P 72/7434* (2026.01); *H10P 72/7442* (2026.01)

(58) Field of Classification Search
CPC ... H10P 72/74; H10P 72/7412; H10P 72/7434
See application file for complete search history.

(56) References Cited

U.S. PATENT DOCUMENTS

2023/0073554 A1*   3/2023   Zhai ...................... H10W 90/00

FOREIGN PATENT DOCUMENTS

JP      2012-142374 A     7/2012

* cited by examiner

*Primary Examiner* — Christopher A Johnson
(74) *Attorney, Agent, or Firm* — Knobbe, Martens, Olson & Bear, LLP

(57) ABSTRACT

A method for efficiently producing circuit patterns (semi-conductor devices) that allows for effortless pickup of circuit patterns after dicing. The method includes producing a semiconductor substrate with circuit patterns formed on a first surface; forming a first laminate by bonding a first support through a first adhesive layer to the first surface; forming a second laminate by bonding a second support through a second adhesive layer having a dot pattern to a second surface opposite to the first surface; debonding the first support from the second laminate; and picking up the circuit patterns from the second support.

13 Claims, 13 Drawing Sheets

START

PRODUCE SEMICONDUCTOR SUBSTRATE — S01

FORM FIRST LAMINATE — S02

GRIND SEMICONDUCTOR SUBSTRATE — S03

PERFORM DICING — S04

FORM SECOND LAMINATE — S05

IRRADIATE SECOND LAMINATE WITH LIGHT — S06

DEBOND FIRST SUPPORT FROM SECOND LAMINATE — S07

CLEAN CIRCUIT PATTERNS — S08

PICK UP CIRCUIT PATTERNS FROM SECOND SUPPORT — S09

END

SEMICONDUCTOR DEVICE PRODUCTION METHOD

CROSS-REFERENCE TO RELATED APPLICATIONS

This application claims priority to Japanese Patent Application No. 2023-025032 filed Feb. 21, 2023, the entire content of which is incorporated herein by reference.

BACKGROUND OF THE INVENTION

Technical Field

The present invention relates to a semiconductor device production method.

Related Art

A technique is known in which dicing tape is bonded to the surface of a semiconductor substrate where the circuit patterns (semiconductor devices) are formed, and dicing is performed for each circuit pattern (for example, see Patent Literature 1).

Patent Literature 1: Japanese Unexamined Patent Application, First Publication No. 2012-142374

When individually picking up circuit patterns from the dicing tape after dicing a semiconductor substrate, there are instances where the proper pickup of a circuit pattern is hindered by the adhesion of the dicing tape. The dicing tape adheres to the semiconductor substrate with high adhesion to ensure the semiconductor substrate remains in place during dicing. However, excessive adhesion of the dicing tape poses a risk of damaging the circuit pattern because the circuit pattern then would be pulled with strong force during the process of picking up the circuit pattern. Picking up circuit patterns meticulously to prevent damage is time-consuming, leading to a reduction in the production efficiency of the circuit patterns.

SUMMARY OF THE INVENTION

The present invention has an object of providing a semiconductor device production method that allows for effortless pickup of circuit patterns after dicing, and enables efficient production of circuit patterns (semiconductor devices).

A semiconductor device production method according to an aspect of the present invention includes: producing a semiconductor substrate with circuit patterns formed on a first surface; forming a first laminate by bonding a first support through a first adhesive layer to the first surface; forming a second laminate by bonding a second support through a second adhesive layer having a dot pattern to a second surface opposite to the first surface; debonding the first support from the second laminate; and picking up the circuit patterns from the second support.

According to such an aspect of the present invention, the second support is bonded through the second adhesive layer having a dot pattern to a surface of a semiconductor substrate on which circuit patterns are formed, and therefore, the adhesion between the semiconductor substrate and the second support is reduced. Therefore, when picking up the circuit pattern, the circuit pattern can be effortlessly debonded from the second support. As a result, the circuit patterns (semiconductor devices) can be produced efficiently because the circuit patterns can be effortlessly picked up without damaging the circuit patterns.

BRIEF DESCRIPTION OF THE DRAWINGS

FIG. 5A is a diagram showing a state in which a resist film has been formed on a base material.

FIG. 5B is a diagram showing a state in which the resist film is being subjected to light exposure.

DETAILED DESCRIPTION OF THE INVENTION

Figure 1:
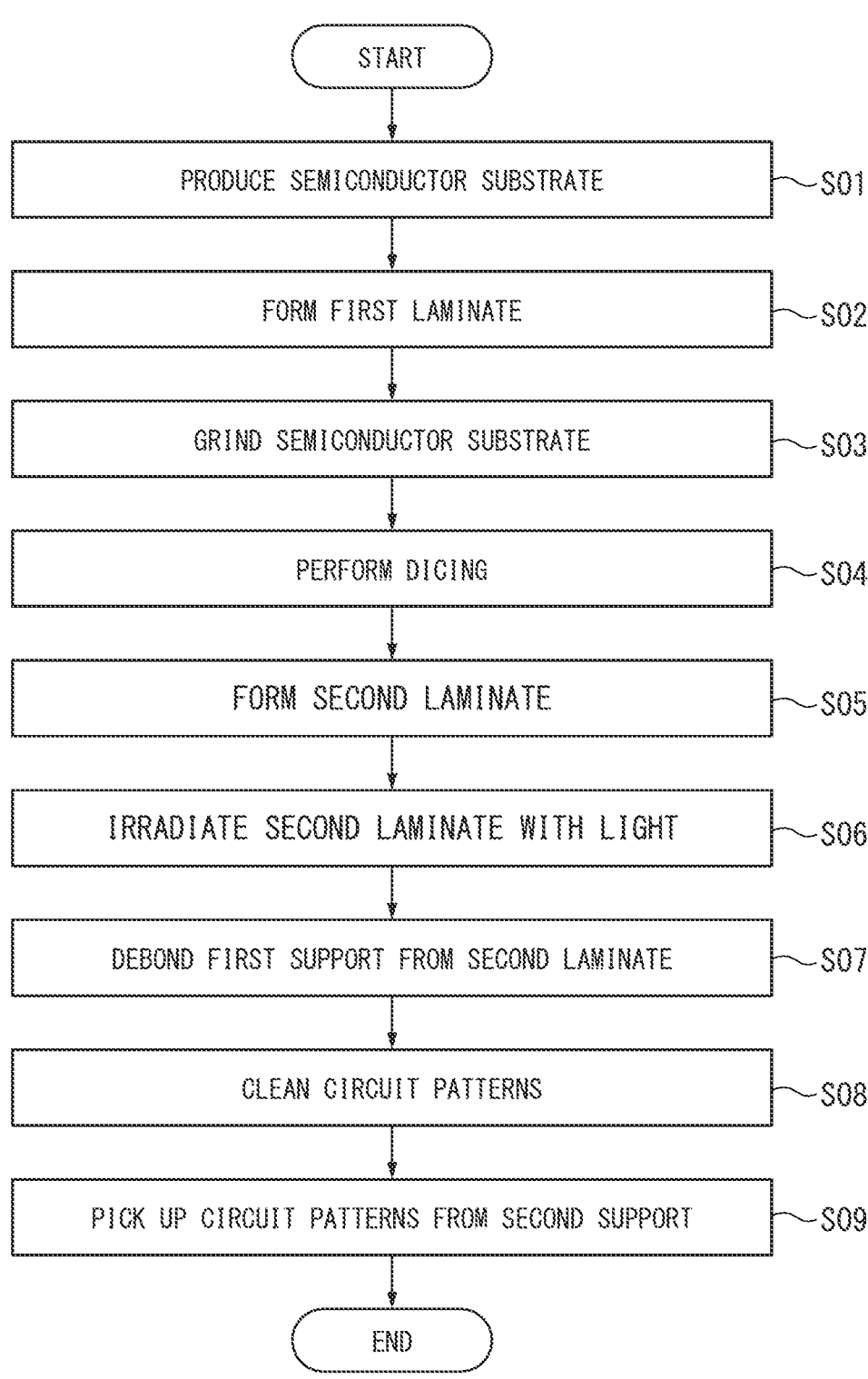
FIG. 1 is a flowchart showing an example of a semiconductor device production method according to an embodiment.

Hereinafter, an embodiment will be described with reference to the drawings. However, the present invention is not limited to what is described below. In the drawings, some elements are emphasized, omitted, or simplified for clarity, and the actual structures, shapes, and scales may vary from what is depicted. An XYZ coordinate system is used to describe the directions in FIG. 4B. In this XYZ coordinate system, a plane parallel to the horizontal plane is defined as an XY plane. On this XY plane, one linear direction is referred to as X direction, and the direction orthogonal to the X direction is referred to as Y direction. The direction perpendicular to the XY plane is referred to as Z direction.

For each of the X direction, the Y direction, and the Z direction, description is made with a definition in which a direction indicated by an arrow is the positive (+) direction and a direction opposite to the direction indicated by the arrow is the negative (−) direction.

Figure 2:
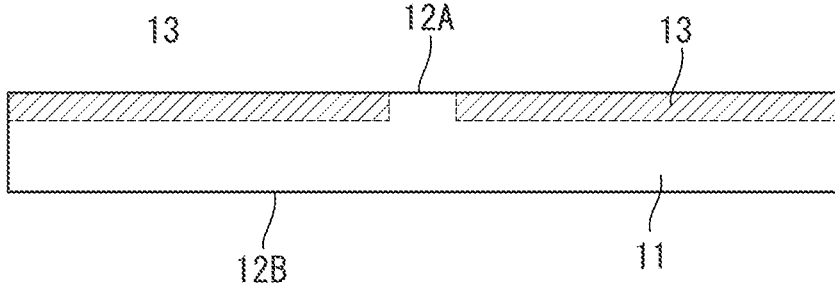
FIG. 2 is a diagram showing an example of a semiconductor substrate.

FIG. 1 is a flowchart showing an example of a semiconductor device production method according to an embodiment. As shown in FIG. 1, first, a semiconductor substrate 11 is produced (Step S01). FIG. 2 is a diagram showing an example of the semiconductor substrate 11. The semiconductor substrate 11 has a first surface 12A and a second surface 12B opposite of the first surface 12A. A silicon wafer, for example, is used for the semiconductor substrate 11. A plurality of circuit patterns 13 (semiconductor devices) are provided on the first surface 12A of the semiconductor substrate 11. The circuit patterns 13 are formed using commonly known techniques, such as laminating a plurality of metal layers and insulation layers. It should be noted that FIG. 2 conceptually shows the circuit patterns 13 formed on the first surface 12A of the semiconductor substrate 11.

Figure 3A:
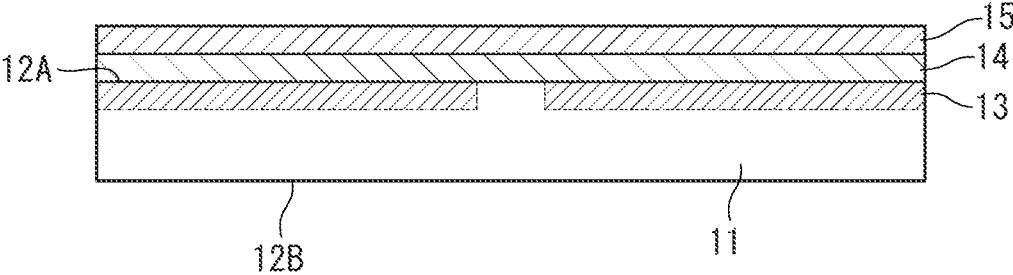
FIG. 3A is a diagram showing a state in which a first adhesive layer and a reaction layer are formed on the semiconductor substrate.
Figure 3B:
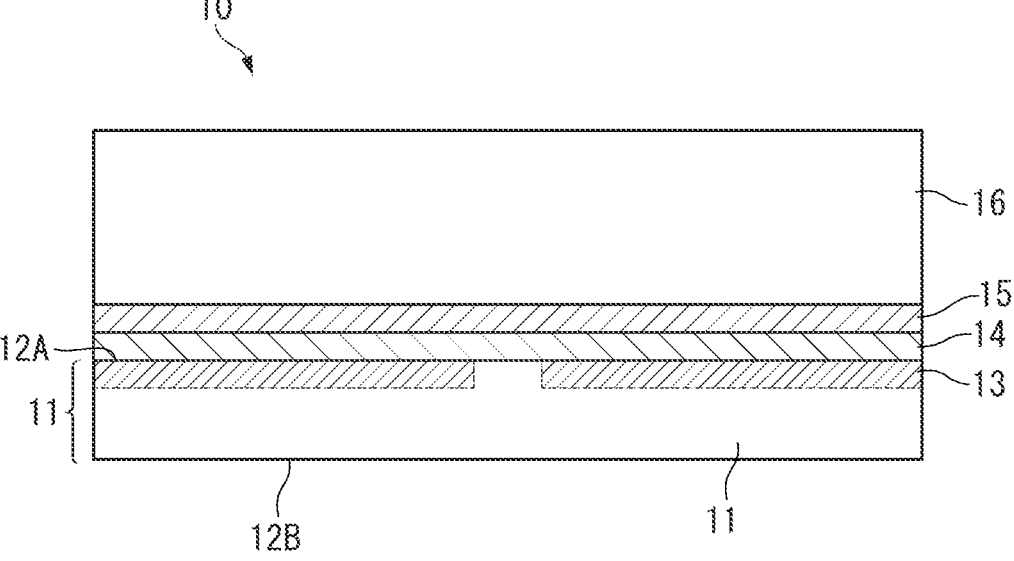
FIG. 3B is a diagram showing an example of a first laminate.

Next, a first laminate 10 is formed (Step S02). FIG. 3A is a diagram showing a state in which a first adhesive layer 14 and a reaction layer 15 are formed on the semiconductor substrate. FIG. 3B is a diagram showing an example of the first laminate 10. In Step S02, firstly, the first adhesive layer 14 is formed on the first surface 12A of the semiconductor substrate 11, and then the reaction layer 15 is formed on the first adhesive layer 14.

The first adhesive layer 14 is formed using commonly known techniques. For example, the first adhesive layer 14 is formed by applying a solution, in which an adhesive is dissolved in a solvent, to the first surface 12A using, for example, a spin coating method, followed by a heat application at 220° C. for 2 to 5 minutes. The first adhesive layer 14 is formed, for example, on the entire surface of the first surface 12A. The method of applying the solution is not limited to the spin coating method, and a roller blade method, a doctor blade method, a spray method, or a slit nozzle method may be used. The thickness of the first adhesive layer 14 is preferably within the range of 1 μm to 200 μm, and more preferably within the range of 5 μm to 150 μm, for example. It is preferable that the thickness of the first adhesive layer 14 be thicker than the reaction layer 15 described later.

Examples of the composition for forming the first adhesive layer 14 include various compositions commonly known in the art, such as acrylic-based, novolac-based, naphthoquinone-based, hydrocarbon-based, polyimide-based, elastomer, and polysulfone-based. Examples of the composition also include those containing other components such as thermoplastic resin, diluting solvent, and additive. The thermoplastic resin (thermoplastic adhesive) may be of any material that exhibits adhesion, such as hydrocarbon resin, acrylic-styrene resin, maleimide resin, elastomer resin, and polysulfone resin, or a combination thereof may preferably be used. It should be noted that the composition includes a diluting solvent.

The reaction layer 15 is formed, for example, on the entire surface of the first adhesive layer 14. The reaction layer 15 undergoes alteration upon light exposure, heat application, or immersion in a solvent. The term "alteration" of the reaction layer 15 here refers to a phenomenon that can bring the reaction layer 15 into a state in which it can be destroyed upon receiving a slight external force, or a state in which the adhesion between the reaction layer 15 and the layer in contact therewith is reduced. The method of forming the reaction layer 15 is not particularly limited, and any commonly known method can be used. For example, the reaction layer 15 is formed by a spin coating method, a roller blade method, a spray method, a slit nozzle method, or a chemical vapor deposition (CVD) method.

For example, the thickness of the reaction layer 15 is more preferably 0.05 μm to 50 μm, and even more preferably 0.3 to 1 μm. With a thickness ranging between 0.05 μm and 50 μm, the reaction layer 15 can undergo desired alteration through brief exposures to light and low-energy light, brief heat application, or brief immersion in a solvent. For the sake of productivity, it is particularly preferable that the thickness of the reaction layer 15 be within the range of 1 μm or less.

Here, as the composition for forming the reaction layer 15, it is sufficient if the substance forming the reaction layer 15, as mentioned above, has a property to alter through brief exposures to light and low-energy light, brief heat application, or brief immersion in a solvent. As for the composition, for example, it contains a resin component with a phenolic skeleton, a polymer with repeating units containing a light-absorbing structure, a fluorocarbon, an inorganic substance, a compound having an infrared-absorbing structure, an infrared-absorbing substance, a reactive polysilsesquioxane, or a combination of these. The composition may contain optional components such as a filler, a plasticizer, a thermal acid-generator component, a photoacid-generator component, an organic solvent component, a surfactant, a sensitizer, or a component that can improve the separability of the support substrate.

The first support 16 is bonded to the first surface 12A through the reaction layer 15 and the first adhesive layer 14. It is desirable that the first support 16 have the necessary strength to prevent damage to or deformation of the semiconductor substrate 11. For the first support 16, a glass substrate is used, for example. The shape of the first support 16 in plan view is, for example, circular to match the semiconductor substrate 11, however, is not particularly limited. The first support 16, in plan view, may be of, for example, a rectangular shape, a polygonal shape, an elliptical shape, an elongated elliptical shape. When bonding the first support 16 to the first surface 12A, the two are heated to a temperature of 215° C. and press-bonded with a pressing force of approximately 4,000 kg, for example. It should be noted that the pressing force applied during the bonding of the semiconductor substrate 11 and the first support 16 is greater than the pressing force applied during the bonding of the semiconductor substrate 11 (first laminate 10) and a second support 20, as described later.

The first laminate 10 is formed by bonding the semiconductor substrate 11 and the first support 16 together. As shown in FIG. 3B, the first laminate 10 is formed by integrally laminating the semiconductor substrate 11, the first adhesive layer 14, the reaction layer 15, and the first support 16 in this order.

Figure 4A:
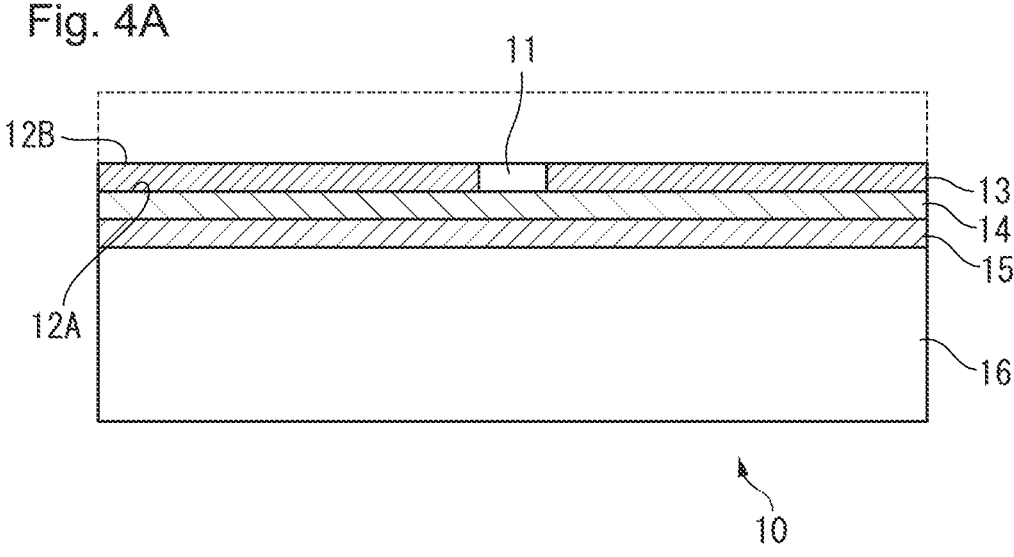
FIG. 4A is a diagram showing a state in which the semiconductor substrate has been subjected to grinding.

Next, the semiconductor substrate 11 is subjected to grinding (polishing) (Step S03). In Step S03, the semiconductor substrate 11 is subjected to grinding to achieve thinning. FIG. 4A is a diagram showing a state in which the semiconductor substrate 11 has been subjected to grinding. A commonly known grinding device is used to grind the semiconductor substrate 11. The first laminate 10 is placed on the stage of this grinding device, for example, with the semiconductor substrate 11 facing upward, and the second surface 12B side of the semiconductor substrate 11 is ground by a grinding pad or the like. That is to say, the surface of the semiconductor substrate 11 opposite of the circuit patterns 13 is ground. The semiconductor substrate 11 is ground, for example, to the extent that grinding reaches the proximity of the circuit patterns 13.

Figure 4B:
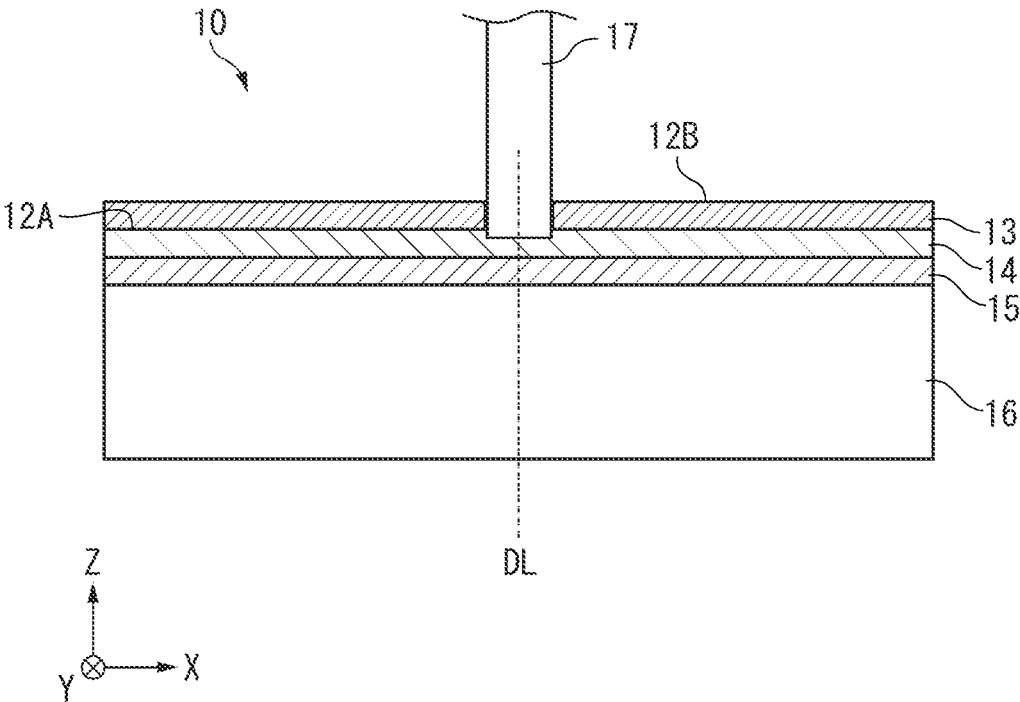
FIG. 4B is a diagram showing a state in which the semiconductor substrate has been diced.

Next, the semiconductor substrate 11 is subjected to dicing (Step S04). In Step S04, the semiconductor substrate 11 is individualized for each circuit pattern 13. FIG. 4B is a diagram showing a state in which the semiconductor substrate 11 has been diced. A commonly known grinding device is used to grind the semiconductor substrate 11. As shown in FIG. 4B, a dicing saw 17 of the dicing device cuts the semiconductor substrate 11 along dicing lines DL (scribe lines) set between circuit patterns 13, thereby individualizing the circuit patterns 13.

The dicing lines DL are set in a grid pattern in the X direction and the Y direction on an XY plane parallel to the first surface 12A and the second surface 12B of the semiconductor substrate 11. The dicing saw 17 performs dicing on the semiconductor substrate 11 by moving along the dicing lines DL in the X direction and the Y direction. In the dicing process, it is acceptable, for example, for the tip end of the dicing saw 17 to reach the first adhesive layer 14. This configuration ensures reliable individualization of the circuit patterns 13.

Next, a second laminate 30 is formed (Step S05). In Step S05, the second laminate 30 (see FIG. 10B) is formed by bonding together the first laminate 10, in which the semiconductor substrate 11 has been subjected to dicing in Step S04, and the second support 20. As will be described later, the second support 20 includes a base material 21 and dots 22A (second adhesive layer 23) (see FIG. 6). First, a method for producing the second support 20 will be described.

Figures 5A, 5B:
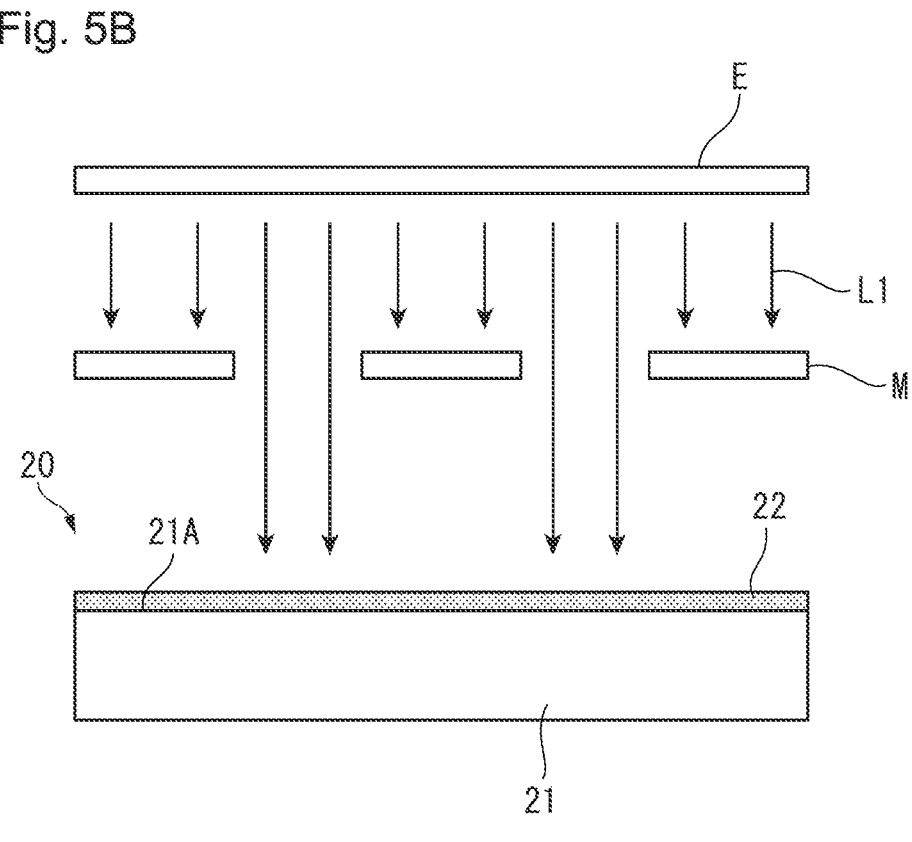
FIG. 5A and FIG. 5B are diagrams showing a method for producing a second support.

FIG. 5A and FIG. 5B are diagrams for describing the method for producing the second support 20, FIG. 5A showing a state in which a resist film has been formed on the base material 21. For example, a silicon substrate is used as the base material 21, but the invention is not limited to this example. The base material 21 may be, for example, a glass substrate. The shape of the base material 21 is, for example, circular as seen in plan view, however, is not particularly limited and may be rectangular, polygonal, elliptical, or elongated elliptical. The base material 21 has a bonding surface 21A. The bonding surface 21A side of the base material 21 is bonded to the second surface 12B of the semiconductor substrate 11. A film 22 is formed on the bonding surface 21A of the base material 21.

As the composition for forming the film 22, for example, a resist is used. While the resist is not strictly limited to positive or negative types, a negative-type resist (hereinafter, referred to as "negative resist") is preferred. Examples of the negative-type resist include a cationic-polymerization-type negative resist, a radical-polymerization-type negative resist, or a photo-crosslinking-type negative resist. Examples of the cationic-polymerization-type negative resist include a mixture of an epoxy resin, a photoacid generator, and a plasticizer such as acrylic and urethane. Examples of the photoacid generator include compounds such as triarylsulfonium salts. Examples of the radical-polymerization-type negative resist include a mixture of an acrylic monomer, a photoradical polymerization initiator, and the plasticizer mentioned above, however, the plasticizer is not essential. Examples of the photo-crosslinking-type negative resist include a mixture of a polyhydroxystyrene (PHSt) polymer, a binder such as melamine, and a photoacid generator.

As shown in FIG. 5A, the film 22 is formed by applying a resist onto the base material 21. The application of the resist is performed using a commonly known coating device and coating method. The application of the resist onto the base material 21 is performed through, for example, a process using a spin coating method in which a certain amount of the resist is dispensed from a nozzle not shown in the drawings onto the base material 21, and the base material 21 is rapidly rotated to spread the resist on the base material 21. Instead of the spin coating method, a commonly known coating method such as a spray method or a slit nozzle method may be used as the resist coating method. Subsequently, prebaking is performed on the base material 21 by heating it at 70° C. to 130° C. to remove the solvent contained in the film 22.

Next, the film 22 is subjected to light exposure. FIG. 5B is a diagram showing a state in which the resist film 22 is being subjected to light exposure. As shown in FIG. 5B, the light exposure process is performed, for example, by irradiating the film 22 with exposure light L1 from a light source E through a mask M created preliminarily to match the outer diameter (pattern) of dots 22A.

Figure 6A:
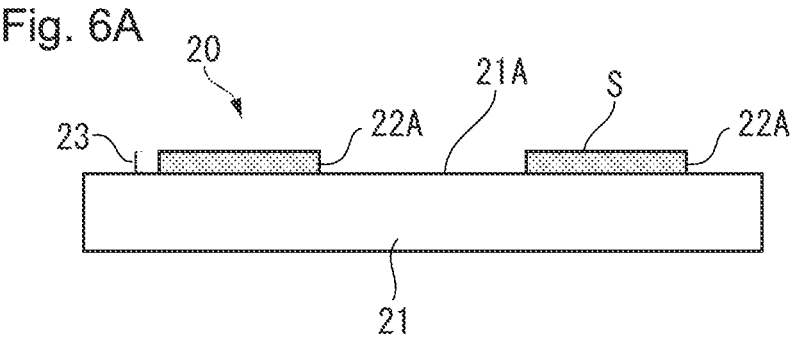
FIG. 6A is a diagram showing a state after developing the resist following the light exposure process.

Next, the film 22 that has been subjected to the light exposure process is subjected to a development process. FIG. 6A is a diagram showing a state after developing the film 22 (resist) following the light exposure process. As shown in FIG. 6A, performing the development process on the film 22 results in the formation of multiple dots (a dot pattern) on the bonding surface 21A of the base material 21. In other words, the second support 20 includes the base material 21 and the dots 22A. A commonly known method is used for the development process. The development process is performed by supplying a developer onto the base material 21 using, for example, a spin developer. Performing the development process results in the formation of the dots 22A on the bonding surface 21A.

The dots 22A serve as the second adhesive layer 23 for bonding the first laminate 10. The dots 22A are formed in a protruding manner above the bonding surface 21A of the base material 21. The multiple dots 22A are formed over the entire surface of the bonding surface 21A. For the dots 22A (second adhesive layer 23), a composition having adhesion (adhesive property) that allows for debonding of the circuit pattern 13 from the base material 21 is used. The adhesion (adhesive property) of the dots 22A with respect to the semiconductor substrate 11 is lower than that of the first adhesive layer 14. The shape of each dot 22A in plan view is set by the mask M mentioned above, and the height of the dots 22A is set as appropriate according to the thickness of the film 22. The dots 22A are each formed in, for example, a cylindrical shape, however, may also be in the shape of a triangular prism, a quadrangular prism, a polygonal prism, an elliptical prism, and so forth. Each of the dots 22A is provided having an equal area S in plan view.

Figure 6B:
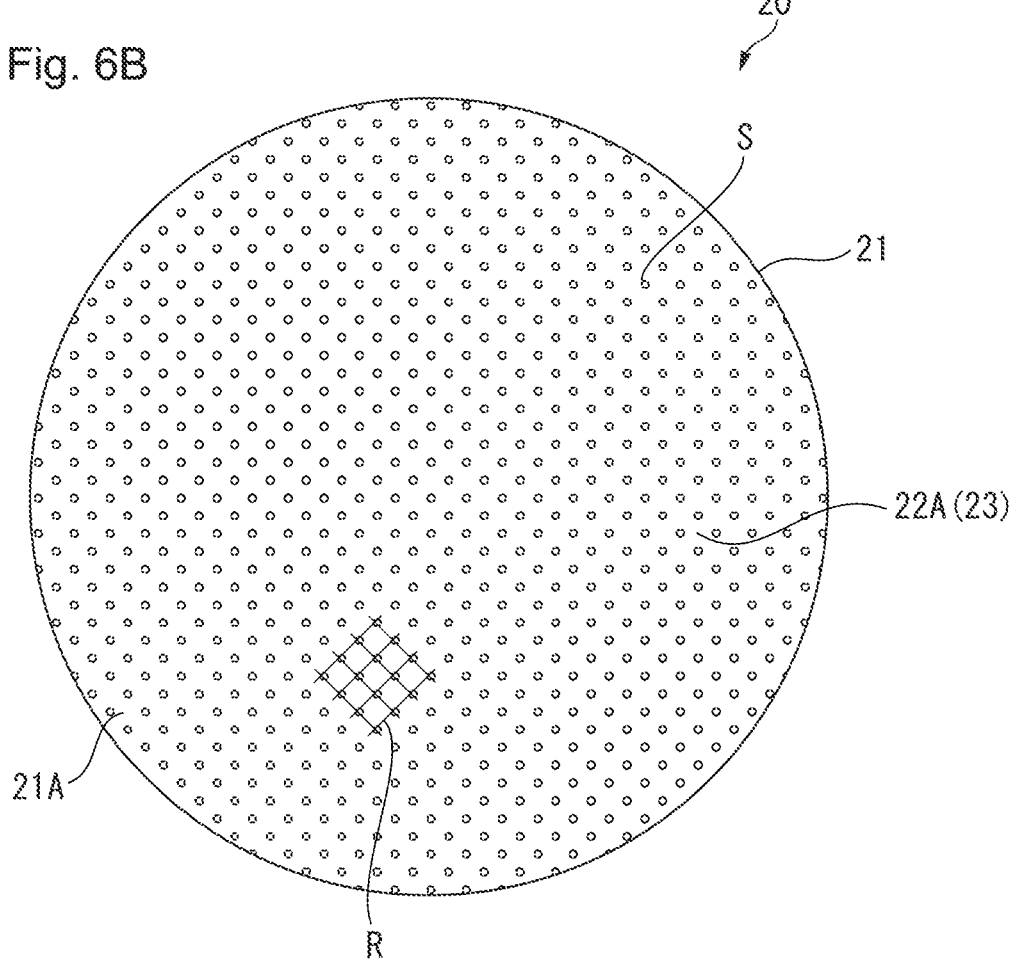
FIG. 6B is a plan view showing an example of the second support.

FIG. 6B is a plan view showing an example of the second support 20. FIG. 6B shows a pattern of dots 22A (dot pattern). As shown in FIG. 6B, the dots 22A are formed over the entire surface of the bonding surface 21A, however, are not limited to this example, and may be formed on a certain region of the bonding surface 21A. As shown with a portion R, the plurality of dots 22A are regularly arranged in a grid pattern, and the plurality of dots 22A are arranged at equal intervals. In other words, the distances between the centers of the dots 22A are equal. However, the dot pattern is not limited to the example shown in FIG. 6B.

For example, the plurality of dots 22A may be arranged discretely (in a scattered or unsystematic manner). That is to say, the distances between the centers of the dots 22A may be unequal. Also, the plurality of dots 22A may each have varying areas when viewed in plan. In such a case, the number of the dots 22A having varying areas may be the same or may vary. Moreover, the number of dots 22A per unit area (for example, per 1 square cm) may be different in a certain region of the bonding surface 21A than in other regions. For example, on the bonding surface 21A, a certain region may have a larger number of dots 22A per unit area than in other regions. That is to say, this certain region may be a high-density region of the dots 22A, and the remaining regions may be low-density regions of the dots 22A.

In such a case, in the certain region, the distances between the centers of the dots 22A are shorter than those in the other regions. The certain region can arbitrarily be set on the bonding surface 21A. For example, the certain region may be arranged discretely on the bonding surface 21A, or may be arranged in a large number in the center portion or the outer periphery portion of the bonding surface 21A. It is acceptable to use dots 22A having the same area S in plan view or dots 22A having varying areas in the one region and in the remaining regions. The shape of the certain region in plan view can be set as appropriate, and may also be rectangular, circular, elliptical, elongated elliptical, or polygonal.

The dots 22A may all have the same height across the entire surface of the bonding surface 21A, or may all vary in height. For example, on the bonding surface 21A, the height of the dots 22A in the certain region may be set higher or lower than that of the dots 22A in the remaining regions. For example, the height difference of the dots 22A is set to be ±5% or less.

Although the second support 20 shown in FIG. 6B has the dots 22A provided over the entire surface of the bonding surface 21A, the invention is not limited to this example. For example, the second support 20 may have the dots 22A formed on the inner side of the outer peripheral portion, which is on the outer peripheral edge side of the bonding surface 21A. The outer peripheral portion is a ring-shaped portion having a constant width from the outer edge of the base material 21, and the width of the outer peripheral portion can be set arbitrarily. The outer peripheral portion is a portion uniformly coated with the film 22 serving as the second adhesive layer 23. The area ratio between the outer peripheral portion and the portions other than the outer peripheral portion can be appropriately set, taking into consideration of the weight of the semiconductor substrate 11 or the first laminate 10. The height of the outer peripheral portion (uniformly coated portion) may be set higher than the dots 22A, or conversely, the height of the outer peripheral portion may be set lower than the dots 22A. Naturally, the height of the outer peripheral portion can be set identical to that of the dots 22A.

Figure 7:
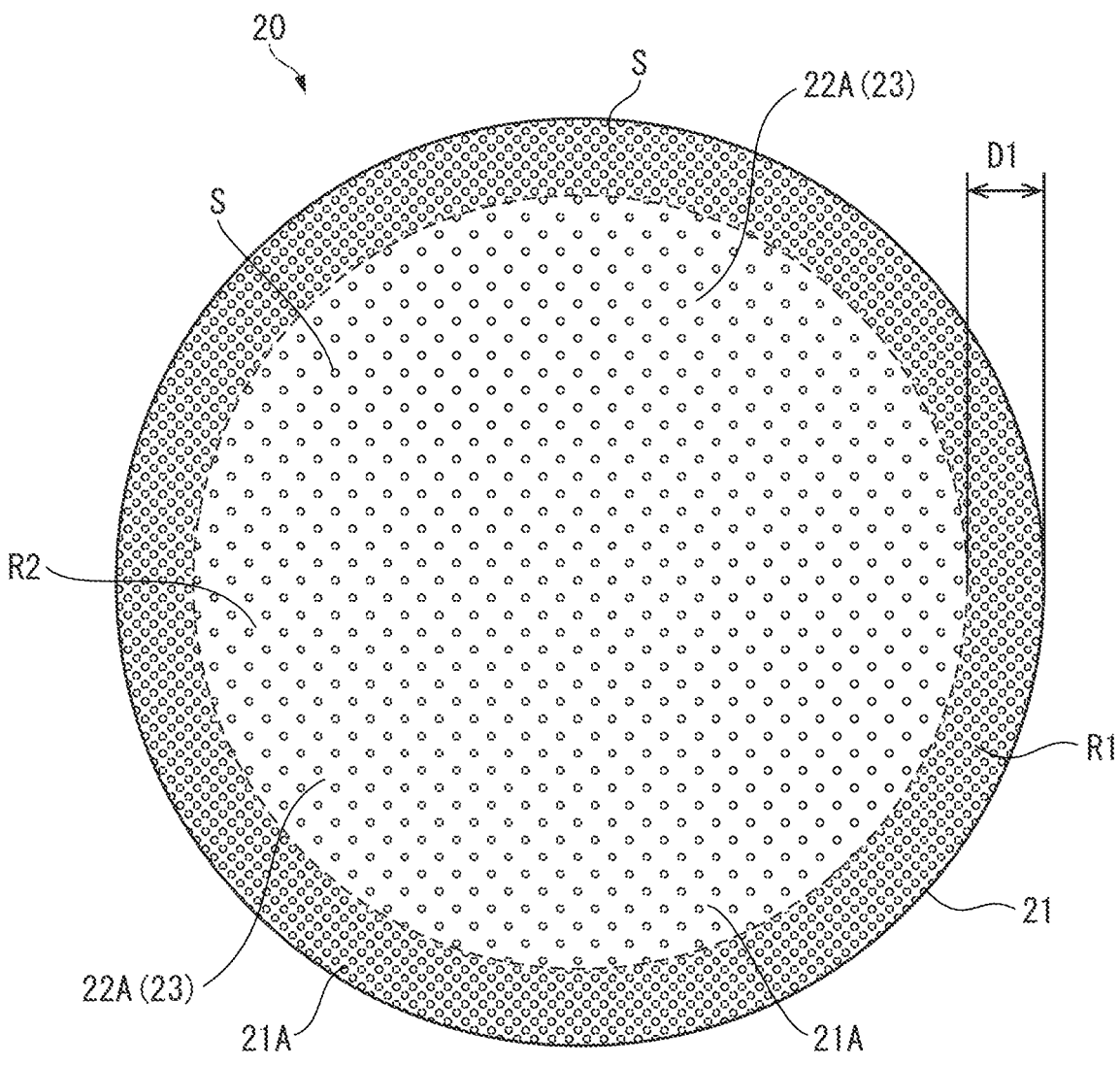
FIG. 7 is a plan view showing another example of the second support.

FIG. 7 is a plan view showing another example of the second support 20. As shown in FIG. 7, the second support 20 has a first region R1 and a second region R2 on the bonding surface 21A. The first region R1 is set in a ring shape with a width D1 extending inward from the outer peripheral edge of the base material 21. The width D1 is approximately 2 mm to 25 mm, and is preferably approximately 3 mm to 10 mm. The second region R2 is arranged on the inner side of the first region R1, and the outer peripheral edge thereof is of a circular shape. However, the shape of the outer peripheral edge is not limited to this example and may be rectangular or polygonal. The occupancy ratio of the dots 22A per unit area varies between the first region R1 and the second region R2. In the first region R1, the occupancy ratio of the dots 22A is 18% to 50%, preferably 18% to 35%. In the second region R2, the occupancy ratio of the dots 22A is 0.13% to 0.79%, preferably 0.18% to 0.6%.

The occupancy ratio of the dots 22A per unit area in the first region R1 is higher than the occupancy ratio of the dots 22A per unit area in the second region R2. In other words, the density of the plurality of dots 22A is higher in the first region R1 than the density of the plurality of dots 22A in the second region R2. The first region R1 is a high-density region of dots 22A, and the second region R2 is a low-density region of dots 22A. In the example shown in FIG. 7, the area S of each dot 22A in plan view is the same between the first region R1 and the second region R2, however, the area of the dots 22A may vary between the first region R1 and the second region R2.

The height of the dots 22A may be set the same or may be set different between the first region R1 and the second region R2. In the case where the heights of the dots 22A are set different, the dots 22A in the first region R1 may be set higher than the dots 22A in the second region R2, or conversely, the dots 22A in the first region R1 may be set lower than the dots 22A in the second region R2. The height difference may be set to be ±5% or less of the height of the dots 22A.

In the case where the height is set higher in the first region R1 than in the second region R2, the dots 22A are lower in the center portion of the bonding surface 21A, and accordingly, lower adhesion can be achieved in the center portion while ensuring higher adhesion in the outer peripheral portion of the semiconductor substrate 11 when bonding together the semiconductor substrate 11 (first laminate 10) and the second support 20. Therefore, the semiconductor substrate 11 can be reliably retained by the second support 20, and the circuit pattern 13 can be effortlessly picked up. On the other hand, in the case where the height is set lower in the first region R1 than in the second region R2, the dots 22A are higher in the center portion of the bonding surface 21A, and accordingly, lower adhesion can be achieved in the outer peripheral portion while ensuring higher adhesion in the center portion of the semiconductor substrate 11 when bonding together the semiconductor substrate 11 (first laminate 10) and the second support 20.

Figure 8:
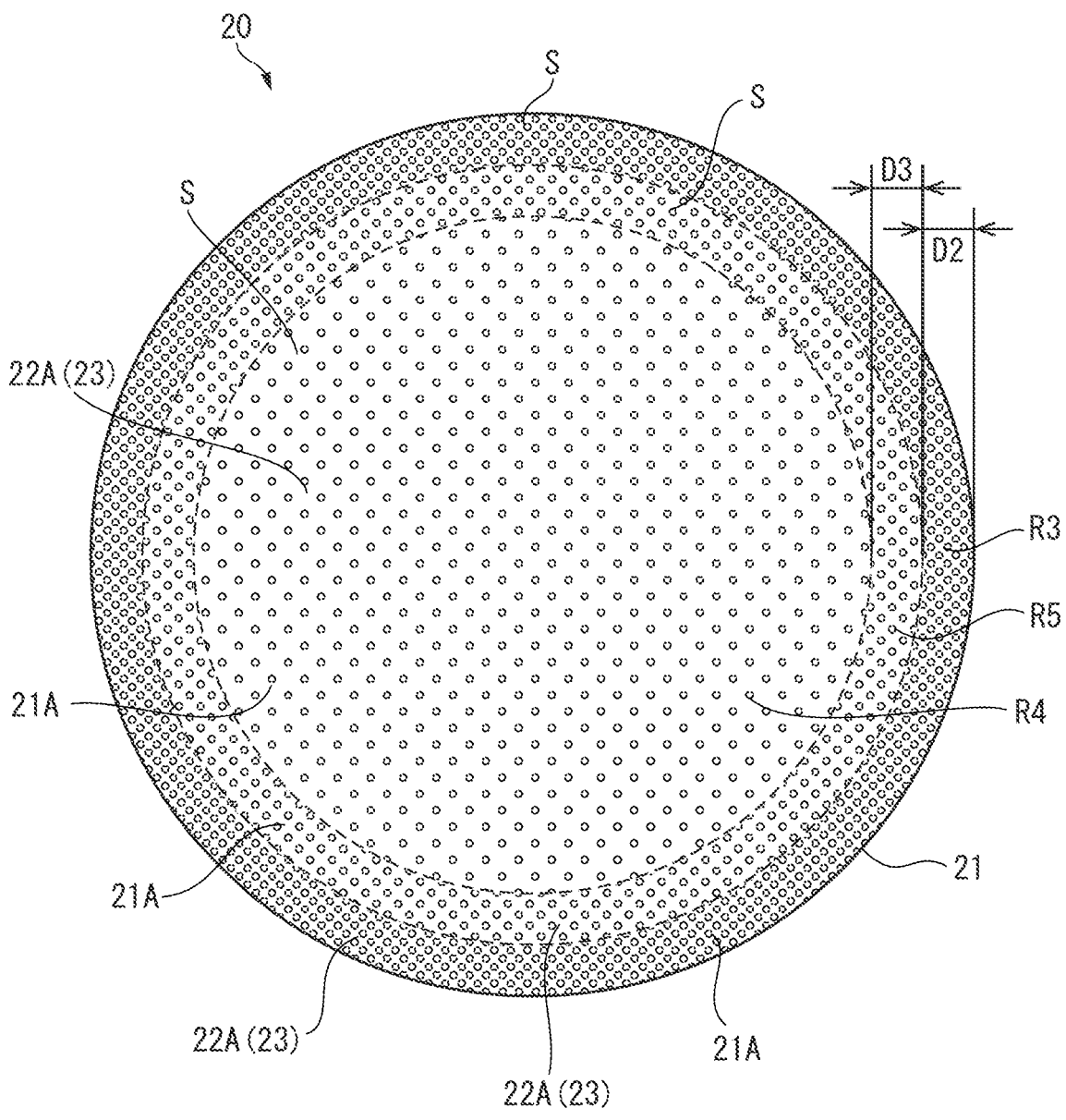
FIG. 8 is a plan view showing still another example of the second support.

FIG. 8 is a plan view showing still another example of the second support 20. As shown in FIG. 8, the second support 20 has a first region R3, a second region R4, and a third region R5 on the bonding surface 21A. The first region R3 is set in a ring shape with a width D2 extending inward from the outer peripheral edge of the base material 21. The width D2 is approximately 2 mm to 25 mm, and is preferably approximately 3 mm to 10 mm. The second region R4 and the third region R5 are arranged on the inner side of the first region R3. The third region R5 is arranged between the first region R3 and the second region R4. The third region R5 is set in a ring shape with a width D3 extending inward from the outer edge thereof. The width D3 is approximately 0.05 mm to 15 mm, and is preferably approximately 0.05 mm to 2 mm. The second region R4 is arranged on the inner side of the third region R5, and the outer edge thereof is of a circular shape.

The occupancy ratio of the dots 22A per unit area varies between the first region R3, the second region R4, and the third region R5. In each of the first region R3, the second region R4, and the third region R5, the occupancy ratio of dots 22A is selected preferably from the range of 0.13% to 40%, more specifically preferably from the range of 0.18% to 18%.

The occupancy ratio of the dots 22A per unit area in the first region R3 is higher than the occupancy ratio of the dots 22A per unit area in the second region R4 and the third region R5. Also, the occupancy ratio of the dots 22A per unit area in the third region R5 is higher than the occupancy ratio of the dots 22A per unit area in the second region R4. In other words, the occupancy ratio of the dots 22A decreases from the outer peripheral edge side of the bonding surface 21A in the first region R3 to the third region R5, and from the outer side to the inner side in the second region R4. That is to say, the density of the dots 22A decreases with approach from the first region R3 to the third region R5 and the second region R4.

In the example shown in FIG. 8, the area S of each dot 22A in plan view is the same between the first region R3, the second region R4, and the third region R5, however, the area of the dots 22A may vary between the first region R3, the second region R4, and the third region R5. The height of the dots 22A may be set the same or may be set different between the first region R3, the second region R4, and the third region R5. For example, the height of the dots 22A may be progressively reduced from the first region R3 to the third region R5 and then to the second region R4. In such a case, the height differences are preferably within ±5%.

In the example shown in FIG. 8, the adhesion with respect to the semiconductor substrate 11 (first laminate 10) gradually decreases with approach from the outer peripheral edge of the bonding surface 21A to the center. Therefore, the adhesion increases on the outer peripheral edge side of the semiconductor substrate 11 and gradually decreases towards the center, and as a result, the semiconductor substrate 11 can be reliably retained by the second support 20, and the circuit pattern 13 can be effortlessly picked up. Moreover, as in the example shown in FIG. 8, the invention is not limited to progressively reducing the occupancy ratio of the dots 22A from the first region R3 to the third region R5 and then to the second region R4. For example, the occupancy ratio of the dots 22A may be progressively increased in the first region R3, the third region R5, and the second region R4, or the occupancy ratio of the dots 22A may be made the highest in the third region R5.

Figure 9:
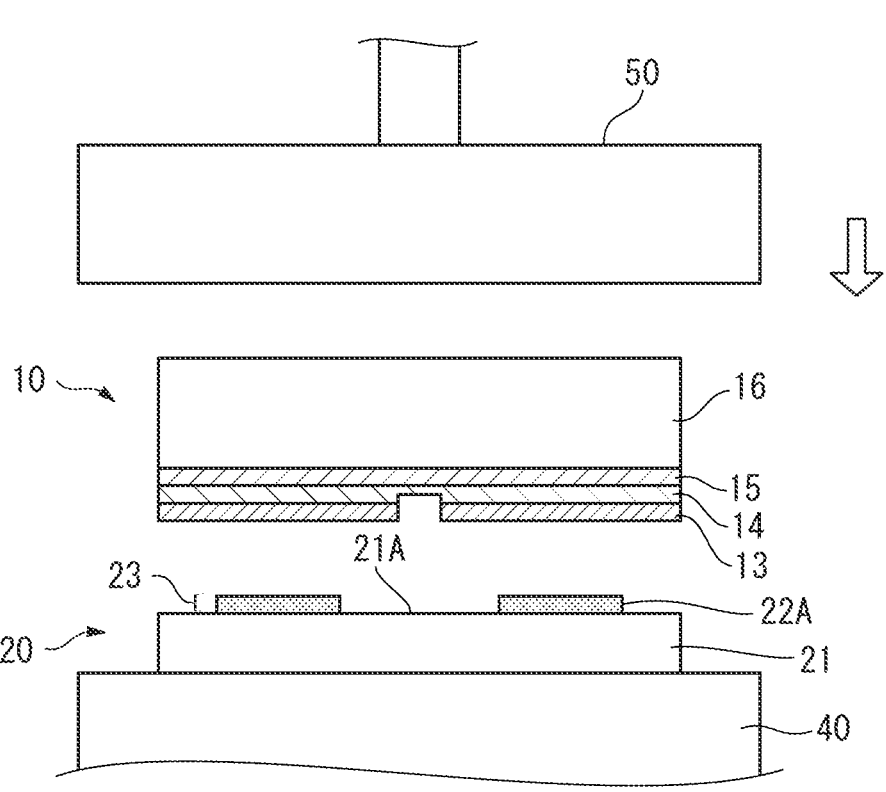
FIG. 9 is a diagram showing a state in which the first laminate and the second support are arranged.

After the second support 20 has been formed as described above, the first laminate 10 and the second support 20 are bonded together. FIG. 9 is a diagram showing a state in which the first laminate 10 and the second support 20 are arranged. For example, a bonding device is used to bond the first laminate 10 and the second support 20 together. FIG. 9 shows the state in which the first laminate 10 and the second support 20 are placed in the bonding device. As shown in FIG. 9, the bonding device includes a supporting table 40 and a pressing plate 50. The bonding device may include, for example, a chamber that accommodates the supporting table 40 and the pressing plate 50, and may bond together the first laminate 10 and the second support 20 while maintaining the interior of the chamber in an atmospheric state.

The second support 20 is placed on the supporting table 40. The second support 20 is brought and placed onto the supporting table 40 by, for example, a transport arm or the like not shown in the drawings. The second support 20 is placed on the supporting table 40 with the dots 22A (second adhesive layer 23) facing upward. The first laminate 10 is transported to above the second support 20 by, for example, a transport arm or the like not shown in the drawings, and then is stacked on the second support 20. The first laminate 10 is stacked on the second support 20 with the circuit patterns 13 facing downward. When stacking the first laminate 10 on the second support 20, one or both of the first laminate 10 and the second support 20 may be aligned so that the two overlap accurately.

Figure 10A:
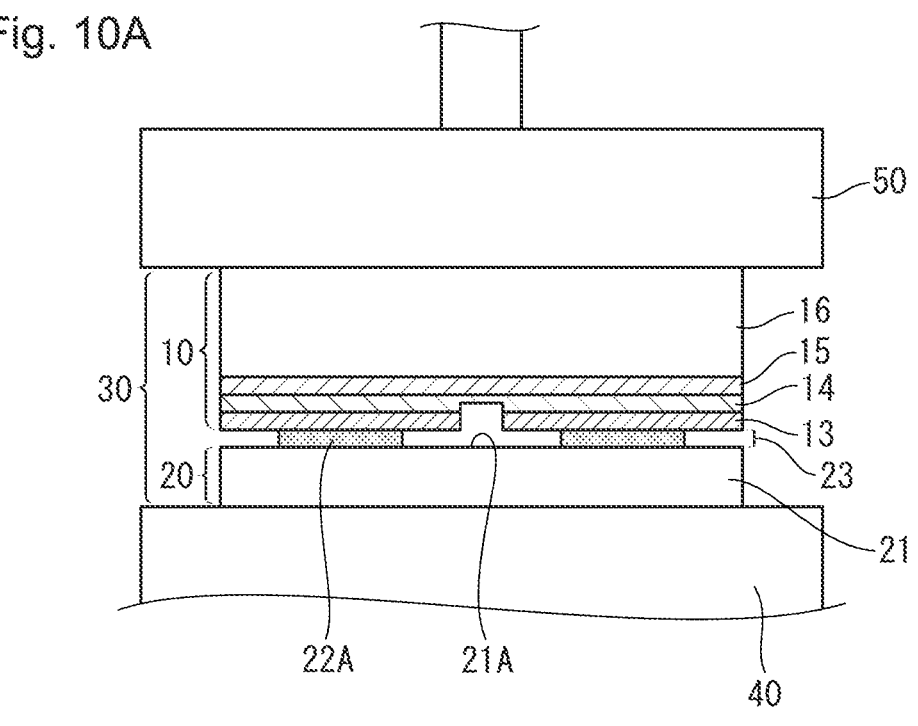
FIG. 10A is a diagram showing a state in which the first laminate and the second support are bonded together.

The pressing plate 50 is arranged above the supporting table 40. The pressing plate 50 is supported so as to be vertically movable, and is vertically moved by a driving device not shown in the drawings. FIG. 10A is a diagram showing a state in which the first laminate 10 and the second support 20 are bonded together. As shown in FIG. 10A, as the pressing plate 50 descends, the lower surface of the pressing plate 50 comes into contact with the upper surface of the first laminate 10 and presses the first laminate 10 downward, resulting in the second support 20 and the first laminate 10 being pressed and bonded together. At this time, these two are heated at a temperature between approximately 50° C. and 150° C. and bonded together under a pressure of approximately 100 kgf to 4,000 kgf. It should be noted that the pressing force applied during the bonding of the first laminate 10 and the second support 20 is smaller than the pressing force applied during the bonding of the semiconductor substrate 11 and the first support 16.

Figure 10B:
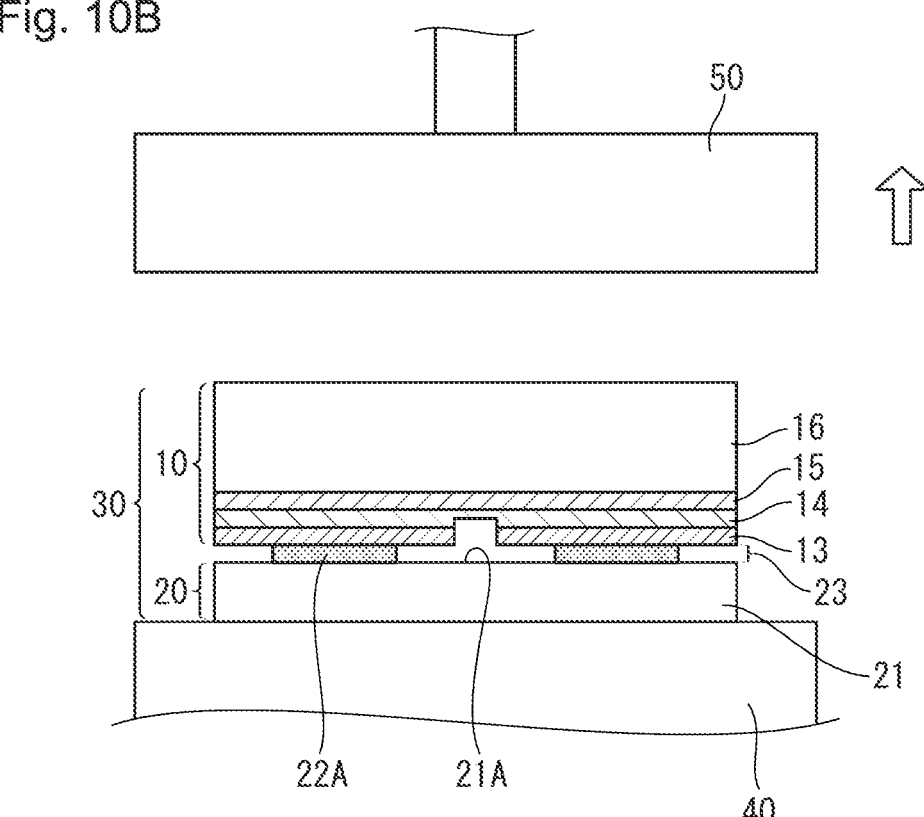
FIG. 10B is a diagram showing a state in which a second laminate has been formed.

FIG. 10B is a diagram showing a state in which a second laminate 30 has been formed. After bonding the second support 20 and the first laminate 10 together under pressure by lowering the pressing plate 50, as shown in FIG. 10B, the second laminate 30 is formed on the supporting table 40 by raising the pressing plate 50 and separating it from the first laminate 10. Through the processes from FIG. 5A to FIG. 10B mentioned above, the second laminate 30 is formed as in Step S05 shown in FIG. 1. The second laminate 30 is now in a state in which the circuit patterns 13 of the first laminate 10 and the dots 22A of the second support 20 are bonded together.

The dot 22A is bonded to a certain region of the circuit pattern 13. It should be noted that in FIG. 10B, for ease of description, the configuration is shown where one dot 22A is adhered to one circuit pattern 13. However, it is also acceptable for multiple dots 22A to be in contact with one circuit pattern 13. That is to say, the number of dots 22A that come into contact with one circuit pattern 13 is arbitrary. Also, as shown in FIG. 10B, there are areas within the circuit pattern 13 to which the dot 22A is not adhered. In other words, one circuit pattern 13 is partially adhered to the second adhesive layer 23 through the dot 22A.

Figures 11A, 11B:
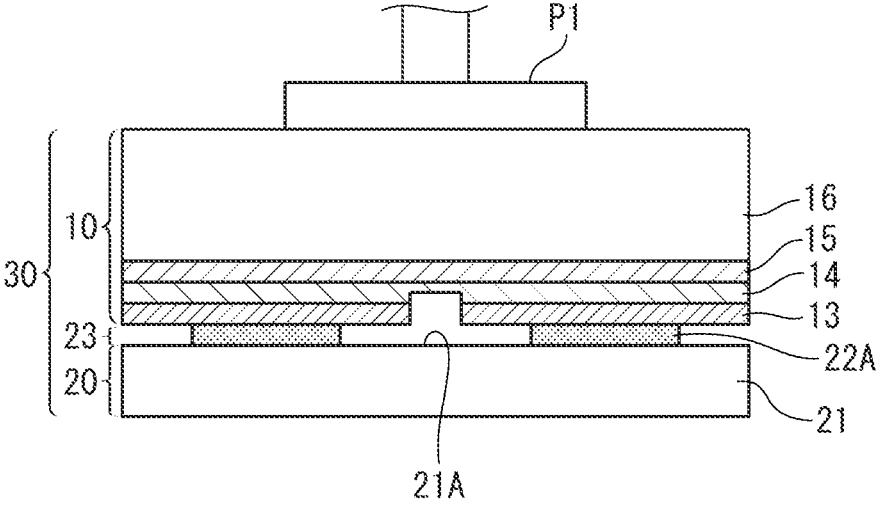
FIG. 11A is a diagram showing a state in which the second laminate is being irradiated with light.
FIG. 11B is a diagram showing a state in which a suction pad is adhering to the first support.

Subsequently, the second laminate 30 is subjected to light exposure (Step S06). In Step S06, an illumination device is used to irradiate the second laminate 30 with light L2. FIG. 11A is a diagram showing a state in which the second laminate 30 is being irradiated with the light L2 from a light source I of the illumination device. The illumination device includes the light source I that emits the light L2. As shown in FIG. 11A, the light L2 from the light source I is irradiated from the first support 16 side of the second laminate 30. The light L2 is irradiated onto the reaction layer 15 through the first support 16. As the light L2, light with a wavelength capable of causing the reaction layer 15 to alter is used. As the light source I, for example, a UV laser source, a high-pressure mercury lamp, or the like is used.

The reaction layer 15 undergoes alteration in response to the irradiation of the light L2 through the first support 16. As described above, as a result of the alteration of the reaction layer 15, the reaction layer 15 is in a state in which it can be destroyed upon receiving a slight external force, or a state in which the adhesive force between the reaction layer 15 and the layer in contact therewith is reduced. That is to say, the first support 16 can be debonded from the second laminate 30. It should be noted that the method used in Step S06 can be changed to another method. For example, instead of Step S06, a method of causing the reaction layer 15 to alter by heating the second laminate 30 may be applied, or a method of immersing the second laminated 30 in a solution that causes the reaction layer 15 to alter may be applied.

Subsequently, the first support 16 is debonded from the second laminate 30 (Step S07). In Step S06, a debonding device that debonds the first support 16 from the second laminate 30 is used. FIG. 11B is a diagram showing a state in which a suction pad P1 of a suction device is adhering to the first support 16. The debonding device has the suction pad P1 capable of adhering to the first support 16 on the lower surface side. The suction pad P1 can be moved vertically by a driving device not shown in the drawings. As shown in FIG. 11B, the suction pad P1 descends to the upper surface of the first support 16, and adheres to the first support 16 as coming into contact with the the first support 16.

Figure 12A:
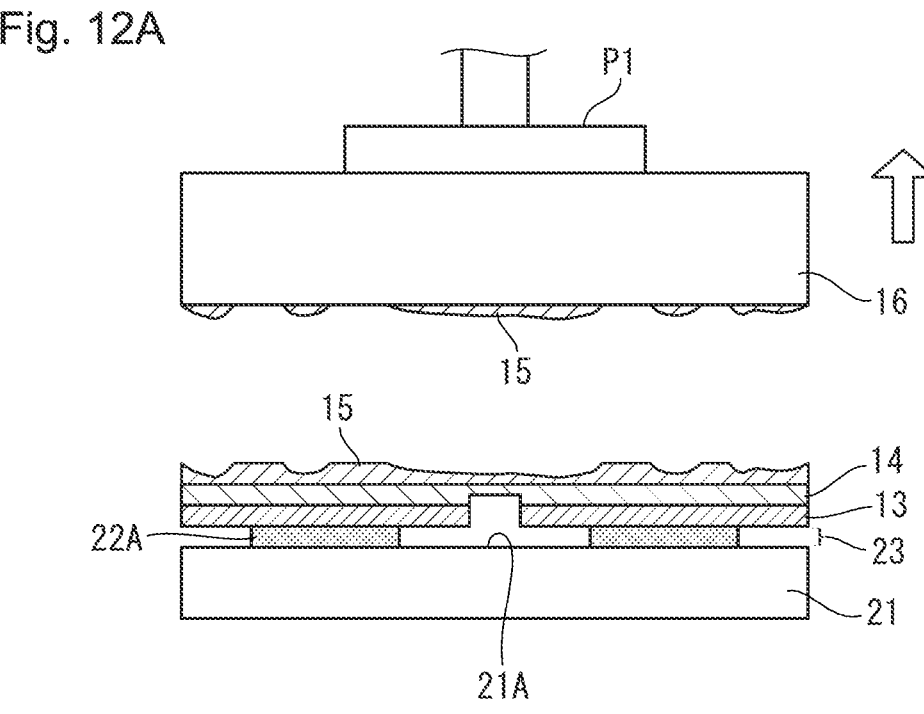
FIG. 12A is a diagram showing a state in which the first support has been debonded.

Subsequently, by raising the suction pad P1, the reaction layer 15 having altered is destroyed, and the first support 16 is lifted from the second laminate 30. FIG. 12A is a diagram showing a state in which the first support 16 has been debonded from the second laminate 30. As shown in FIG. 12A, the ascent of the suction pad P1 results in the debonding of the first support 16 from the second laminate 30. That is to say, the first support 16 has been debonded from the circuit patterns 13. At this time, residues of the first adhesive layer 14 and the reaction layer 15 remain on the upper surface of the circuit patterns 13 (where the first support 16 was bonded).

Figure 12B:
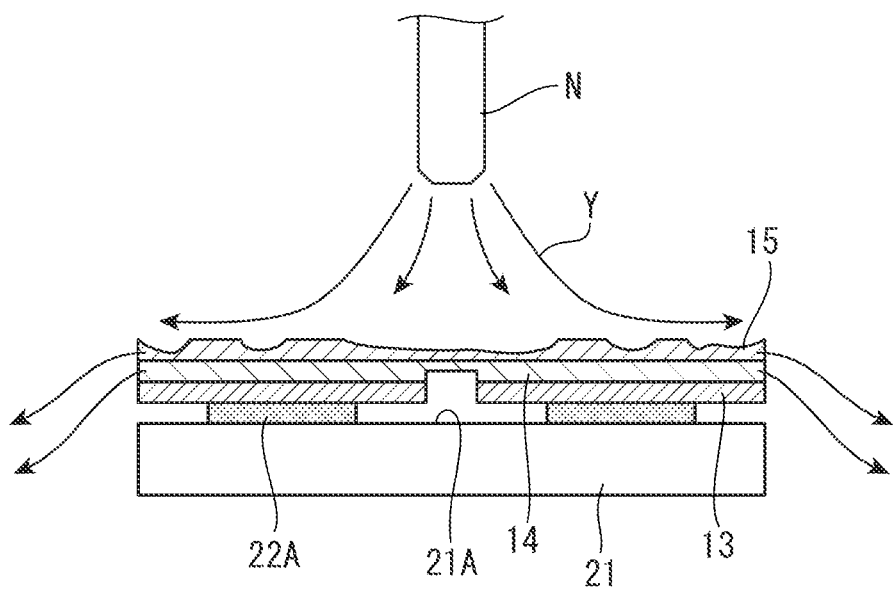
FIG. 12B is a diagram showing a state in which the semiconductor substrate is being cleaned.

Subsequently, the circuit patterns 13 are cleaned (Step S08). In Step S08, a cleaning device is used to clean the circuit patterns 13 following the debonding of the first support 16. FIG. 12B is a diagram showing a state in which the circuit patterns 13 are being cleaned using a cleaning fluid Y. As shown in FIG. 12B, the cleaning device has a nozzle N that discharges the cleaning fluid Y. The nozzle N is arranged above the circuit patterns 13. The cleaning fluid Y is discharged from the nozzle N to rinse off any residue of the reaction layer 15 on the surface of the circuit patterns 13, and dissolve and remove the first adhesive layer 14.

Figure 13A:
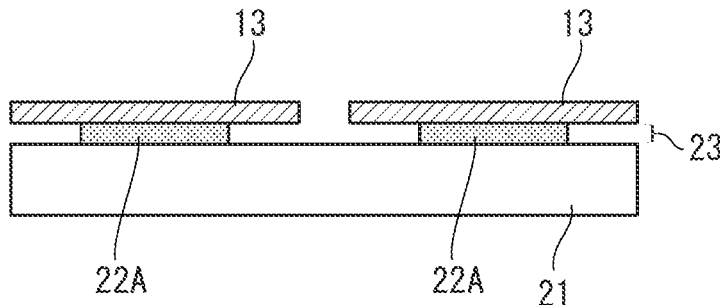
FIG. 13A is a diagram showing circuit patterns after cleaning.

The cleaning fluid Y used dissolves the first adhesive layer 14 but does not dissolve the dots 22A (second adhesive layer 23). As the cleaning fluid Y, a hydrocarbon solvent, an ester solvent, or a mixture thereof may be used, and examples include p-menthane, decalin, propylene glycol monomethyl ether acetate (PGMEA). FIG. 13A is a diagram showing the state of circuit patterns 13 after the cleaning. As shown in FIG. 13A, the cleaning process of Step S08 removes residues of the reaction layer 15 and the first adhesive layer 14, leaving the circuit patterns 13 in the state of being adhered to the dots 22A.

Figure 13B:
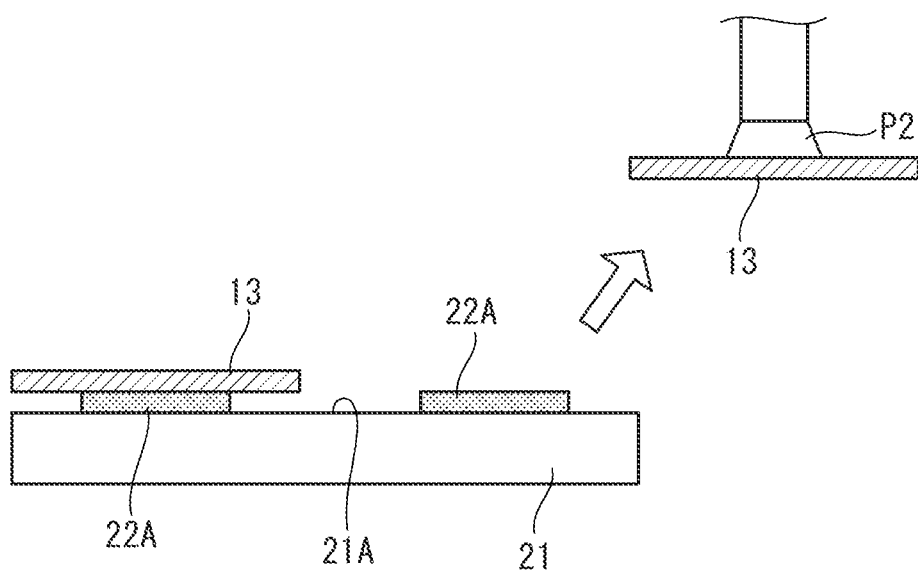
FIG. 13B is a diagram showing a state in which a circuit pattern has been picked up from the second support.

Subsequently, the circuit pattern 13 is picked up from the second support 20 (Step S09). In Step S09, a pickup device is used to pick up the circuit pattern 13 from the second support 20. FIG. 13B is a diagram showing a state in which the circuit pattern 13 has been picked up from the second support 20. The pickup device has a suction pad P2 capable of adhering to the circuit pattern 13 on the lower surface side. The suction pad P2 can be moved vertically and horizontally by a driving device not shown in the drawings. As shown in FIG. 13B, the suction pad P2 descends to the upper surface of the circuit pattern 13, and adheres to the circuit pattern 13 as coming into contact with the the circuit pattern 13.

Subsequently, the suction pad P2 is lifted and moved to debond the circuit pattern 13 from the second support 20 (dot 22A). By repeating this operation for each individual circuit pattern 13, multiple circuit patterns 13 supported by the second support 20 are extracted from the second support 20.

At this time, each circuit pattern 13 is gently adhered to the dot 22A, allowing for the debonding of the circuit pattern

13 from the second support 20 with a small force. In other words, a large driving force is not necessary when driving the suction pad P2 to debond each circuit pattern 13. As a result, it becomes possible to rapidly debond each circuit pattern 13, using the suction pad P2. Moreover, because the adhesion between the circuit pattern 13 and the dot 22A is low, it is possible to prevent damage to the circuit pattern 13 when debonding it.

Thus, in the embodiment described above, each circuit pattern 13 is adhered to the dot 22A in the second support 20, and due to this low adhesion with respect to the circuit patterns 13, the circuit pattern 13 can be effortlessly debonded from the second support 20. As a result, the pickup of circuit patterns 13 can be expedited, enabling the efficient production of the circuit patterns 13 (semiconductor devices). Also, as described above, preventing damage to the circuit patterns 13 in the process of debonding from the second support 20 helps minimize the reduction in yield during the production of the circuit patterns 13 (semiconductor devices).

The embodiment of the present invention has been described above. However, the technical scope of the invention is not limited to the description of the above embodiment. It is apparent to those skilled in the art that various modifications or improvements can be added to the above embodiment. The technical scope of the present invention also encompasses one or more of such modifications or improvements. One or more of the requirements described in the above embodiment may be omitted in some cases. One or more of the requirements described in the above embodiment may be combined where appropriate. The order of executing processes shown in the present embodiment can be realized in an arbitrary order unless the result of the previous processing is used in the following processing. While operations in the above embodiment have been described with expressions such as "first", "next", and "subsequently" for the sake of convenience, the operations need not always be implemented in that order.

DESCRIPTION OF REFERENCE SIGNS

10: First laminate
11: Semiconductor substrate
12A: First surface
12B: Second surface
13: Circuit pattern (semiconductor device)
14: First adhesive layer
15: Reaction layer
16: First support
20: Second support
21: Base material
22: Film
22A: Dot
23: Second adhesive layer
30: Second laminate
Y: Cleaning fluid
What is claimed is:

1. A semiconductor device production method comprising:
    producing a semiconductor substrate with circuit patterns formed on a first surface;
    forming a first laminate by bonding a first support through a first adhesive layer to the first surface;
    forming a second laminate by bonding a second support through a second adhesive layer having a dot pattern to a second surface opposite to the first surface;
    debonding the first support from the second laminate; and
    picking up the circuit patterns from the second support.
2. The semiconductor device production method according to claim 1, wherein the dot pattern of the second adhesive layer is provided at least in a certain region between the semiconductor substrate and the second support.

3. The semiconductor device production method according to claim 1, wherein the dot pattern is formed by exposure and development processing using a resist.

4. The semiconductor device production method according to claim 1, wherein when bonding the second support to the semiconductor substrate, a plurality of dots are interposed between the circuit patterns and the second support.

5. The semiconductor device production method according to claim 1, wherein adhesion of the second adhesive layer interposed between the semiconductor substrate and the second support is lower than that of the first adhesive layer interposed between the semiconductor substrate and the first support.

6. The semiconductor device production method according to claim 1, wherein a pressing force used in bonding the semiconductor substrate and the first support is greater than that used in bonding the semiconductor substrate and the second support.

7. The semiconductor device production method according to claim 1, further comprising grinding the semiconductor substrate in the first laminate.

8. The semiconductor device production method according to claim 1, further comprising dicing the semiconductor substrate of the first laminate to individualize each circuit pattern.

9. The semiconductor device production method according to claim 1, wherein, in the first laminate, a reaction layer that undergoes alteration upon exposure to light is provided between the semiconductor substrate and the first adhesive layer, and wherein the method comprises irradiating the reaction layer with the light to allow debonding of the first support from the second laminate.

10. The semiconductor device production method according to claim 9, wherein the first support is a glass substrate, and the light is irradiated onto the reaction layer through the glass substrate.

11. The semiconductor device production method according to claim 1, comprising debonding the first support from the second laminate, followed by cleaning the circuit patterns with a cleaning fluid, wherein the cleaning fluid dissolves the first adhesive layer while having inability or limited ability to dissolve the second adhesive layer.

12. The semiconductor device production method according to claim 1, wherein the first adhesive layer is formed using a thermoplastic adhesive.

13. The semiconductor device production method according to claim 1, wherein the second adhesive layer is formed using a cationic-polymerization-type negative resist, a radical-polymerization-type negative resist, or a photo-cross-linking-type negative resist.

* * * * *